(12) United States Patent
Kim et al.

(10) Patent No.: US 11,984,344 B2
(45) Date of Patent: May 14, 2024

(54) LIFT APPARATUS AND SUBSTRATE PROCESSING APPARATUS INCLUDING THE SAME

(71) Applicant: SAMSUNG ELECTRONICS CO., LTD., Suwon-si (KR)

(72) Inventors: Byeongsang Kim, Hwaseong-si (KR); Keonwoo Kim, Yongin-si (KR); Wooram Kim, Bupyeong-gu (KR); Eungsu Kim, Seoul (KR); Heewon Min, Daejeon (KR); Sangwook Park, Seongnam-si (KR); Seungwon Shin, Seoul (KR); Dongyun Yeo, Seoul (KR); Geunsik Oh, Suwon-si (KR); Hyanjung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 256 days.

(21) Appl. No.: 16/895,513

(22) Filed: Jun. 8, 2020

(65) Prior Publication Data

US 2021/0159112 A1    May 27, 2021

(30) Foreign Application Priority Data

Nov. 25, 2019    (KR) .................. 10-2019-0152593

(51) Int. Cl.
*H01L 21/687* (2006.01)
*H01J 37/20* (2006.01)
(Continued)

(52) U.S. Cl.
CPC ........ *H01L 21/68742* (2013.01); *H01J 37/20* (2013.01); *H01L 21/67242* (2013.01); *H01L 21/6831* (2013.01); *H01J 2237/334* (2013.01)

(58) Field of Classification Search
None
See application file for complete search history.

(56) References Cited

U.S. PATENT DOCUMENTS 6,578,423 B2    6/2003    Fischer
7,292,428 B2    11/2007    Hanawa et al.
(Continued)

FOREIGN PATENT DOCUMENTS

JP    6-252253 A    9/1994
JP    11-354610 A    12/1999
(Continued)

*Primary Examiner* — Jeffrie R Lund
*Assistant Examiner* — Tiffany Z Nuckols
(74) *Attorney, Agent, or Firm* — Sughrue Mion, PLLC

(57) ABSTRACT

A lift apparatus for moving an object up and down in a substrate processing apparatus, the lift apparatus including a body configured to support the object while a lift hole, included in the body, is overlapped by the object in a vertical direction; a lift pin configured to move the object up and down by moving up and down in the lift hole; a bellows including an upper flange, a lower flange, and a flexible pipe; a connector combined with a lower portion of the lift pin in the flexible pipe and configured to interfere with downward movement of the lift pin and to allow at least one from among rotation, sliding, and tilting of the lift pin; a load sensor configured to measure vertical load generated in accordance with movement of the lift pin; and an actuator configured to move the lift pin up and down.

20 Claims, 15 Drawing Sheets

(51) Int. Cl.
    *H01L 21/67*    (2006.01)
    *H01L 21/683*    (2006.01)

(56) References Cited

U.S. PATENT DOCUMENTS

| | | | |
|---|---|---|---|
| 7,750,818 | B2 | 7/2010 | Lee |
| 2002/0011204 | A1* | 1/2002 | Gujer ............... C23C 16/4586 |
| | | | 118/500 |
| 2008/0124200 | A1* | 5/2008 | Lee ................. H01L 21/68742 |
| | | | 414/217.1 |
| 2010/0163403 | A1* | 7/2010 | Kitada ................ H01J 37/3244 |
| | | | 204/164 |
| 2010/0187777 | A1* | 7/2010 | Hao ................. H01L 21/68742 |
| | | | 279/142 |
| 2011/0236162 | A1* | 9/2011 | Shikayama ....... H01L 21/68742 |
| | | | 414/222.01 |
| 2018/0166259 | A1* | 6/2018 | Ueda ................ H01J 37/32642 |
| 2019/0035671 | A1* | 1/2019 | Ha ................... H01L 21/68757 |

FOREIGN PATENT DOCUMENTS

| | | | |
|---|---|---|---|
| JP | 2008-177464 A | 7/2008 | |
| JP | 2008-311475 A | 12/2008 | |
| JP | 2017-50534 A | 3/2017 | |
| KR | 10-2006-0023021 A | 3/2006 | |
| KR | 10-2008-0048674 A | 6/2008 | |
| KR | 10-0843107 B1 | 7/2008 | |

\* cited by examiner

LIFT APPARATUS AND SUBSTRATE PROCESSING APPARATUS INCLUDING THE SAME

CROSS-REFERENCE TO THE RELATED APPLICATION

This application is based on and claims priority under 35 U.S.C. § 119 to Korean Patent Application No. 10-2019-0152593, filed on Nov. 25, 2019, in the Korean Intellectual Property Office, the disclosure of which is incorporated herein in its entirety by reference.

BACKGROUND

Some embodiments of the present disclosure relate to a lift apparatus and a substrate processing apparatus including the same, and more particularly, to a lift apparatus capable of moving a substrate or a movable ring up and down in a substrate processing process and a substrate processing apparatus including the same.

A substrate processing apparatus may fix a substrate onto an electrostatic chuck in order to perform a substrate processing process. In addition, the substrate processing apparatus may move the substrate from the electrostatic chuck upward by using a lift pin in order to take out the substrate after the substrate processing process is performed. When the lift pin moves the substrate upward in a state in which electrostatic force between the substrate and the electrostatic chuck is not completely removed, by load applied by the lift pin to the substrate, the substrate may be physically damaged.

In addition, the substrate processing apparatus may move the movable ring up and down in order to change a shape of plasma generated in the substrate processing process. In order to find out a contact initiation point between the movable ring and the lift pin before performing the substrate processing process, a process chamber is set to be in an atmospheric pressure state, which is inconvenient. In addition, while the substrate processing process is performed, it is difficult to measure a height of the movable ring in real time.

SUMMARY

One or more embodiments of the present disclosure relate to a lift apparatus capable of precisely measuring vertical load applied to an object (for example, a substrate or a movable ring) that moves up and down and preventing the object from being physically damaged and a substrate processing apparatus including the same.

One or more embodiments of the present disclosure relate to a lift apparatus capable of finding out a contact initiation point between an object and a lift pin without setting the inside of a process chamber to be in an atmospheric pressure state and a substrate processing apparatus including the same.

One or more embodiments of the present disclosure relate to a lift apparatus capable of measuring vertical load applied to an object in real time and controlling the lift pin in real time based on the load and a substrate processing apparatus including the same.

According to one or more embodiments, a lift apparatus is provided for moving an object up and down in a substrate processing apparatus. The lift apparatus includes a body configured to support the object while a lift hole, included in the body, is overlapped by the object in a vertical direction; a lift pin configured to move the object up and down by moving up and down in the lift hole; a bellows provided under the body and including an upper flange combined with a lower portion of the body; a lower flange spaced apart from the upper flange in the vertical direction; and a flexible pipe interposed between the upper flange and the lower flange and surrounding at least a part of the lift pin; a connector combined with a lower portion of the lift pin in the flexible pipe and configured to interfere with downward movement of the lift pin and to allow at least one from among rotation, sliding, and tilting of the lift pin; a load sensor provided under the connector and configured to measure vertical load generated in accordance with movement of the lift pin and to generate load information; an actuator configured to move the lift pin up and down; and a controller connected to the load sensor and configured to determine at least one of a magnitude of load applied to the object and a contact initiation point between the object and the lift pin based on the load information.

According to one or more embodiments, a substrate processing apparatus is provided. The substrate processing apparatus includes a process chamber configured to regulate a process space for processing a substrate; a processing gas supply connected to the process chamber and configured to supply a processing gas for processing the substrate in the process space; a plasma generator configured to form plasma in the process space; an electrostatic chuck provided in the process space and configured to support the substrate; and at least one lift configured to move one of the substrate and a movable ring surrounding the electrostatic chuck up and down. Each of the at least one lift includes: a body in which a lift hole overlapped by one of the substrate and the movable ring in a vertical direction is formed; a lift pin configured to move in the lift hole in the vertical direction and to move one of the substrate and the movable ring in the vertical direction; a bellows combined with a lower portion of the body; a connector combined with a lower portion of the lift pin in the bellows and configured to interfere with downward movement of the lift pin and to allow at least one from among rotation, sliding, and tilting of the lift pin; a load sensor provided under the connector and configured to measure vertical load generated in accordance with movement of the lift pin and to generate load information; and an actuator configured to move the lift pin up and down.

According to one or more embodiments, a lift apparatus is provided for moving an object up and down in a substrate processing apparatus. The lift apparatus includes a body configured to support the object while overlapped by the object in a vertical direction; a lift pin configured to move up and down in a lift hole and to move the object up and down; a bellows provided under the body; a connector combined with a lower portion of the lift pin in the bellows and configured to interfere with downward movement of the lift pin and allow at least one from among rotation, sliding, and tilting of the lift pin; a load sensor provided under the connector and configured to measure vertical load generated in accordance with movement of the lift pin and to generate load information; and an actuator configured to move the lift pin up and down.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Hereinafter, non-limiting example embodiments of the present disclosure will be described in detail with reference to the accompanying drawings.

Figure 1:
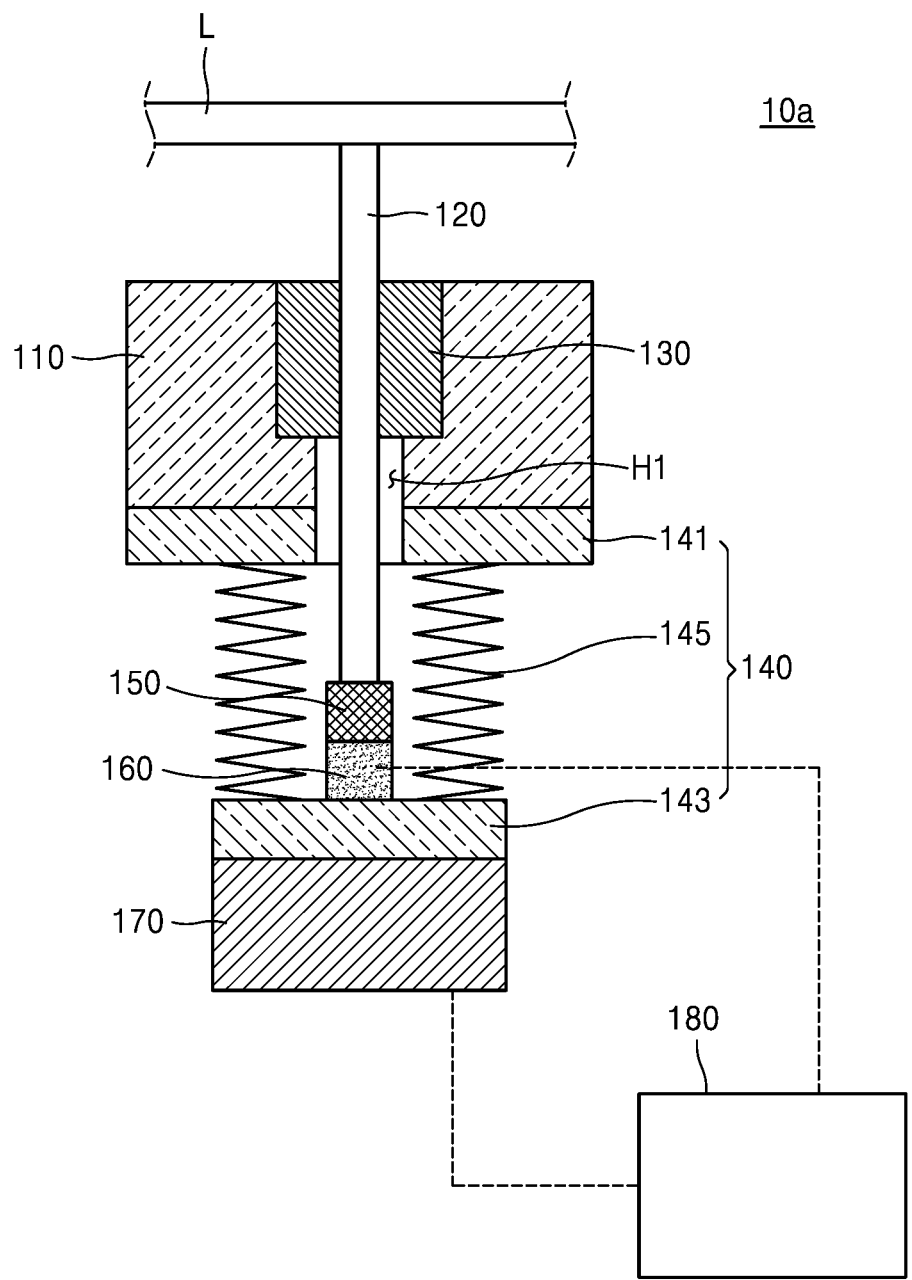
FIG. 1 is a cross-sectional view of a first lift apparatus according to a non-limiting example embodiment of the present disclosure.
Figure 15:
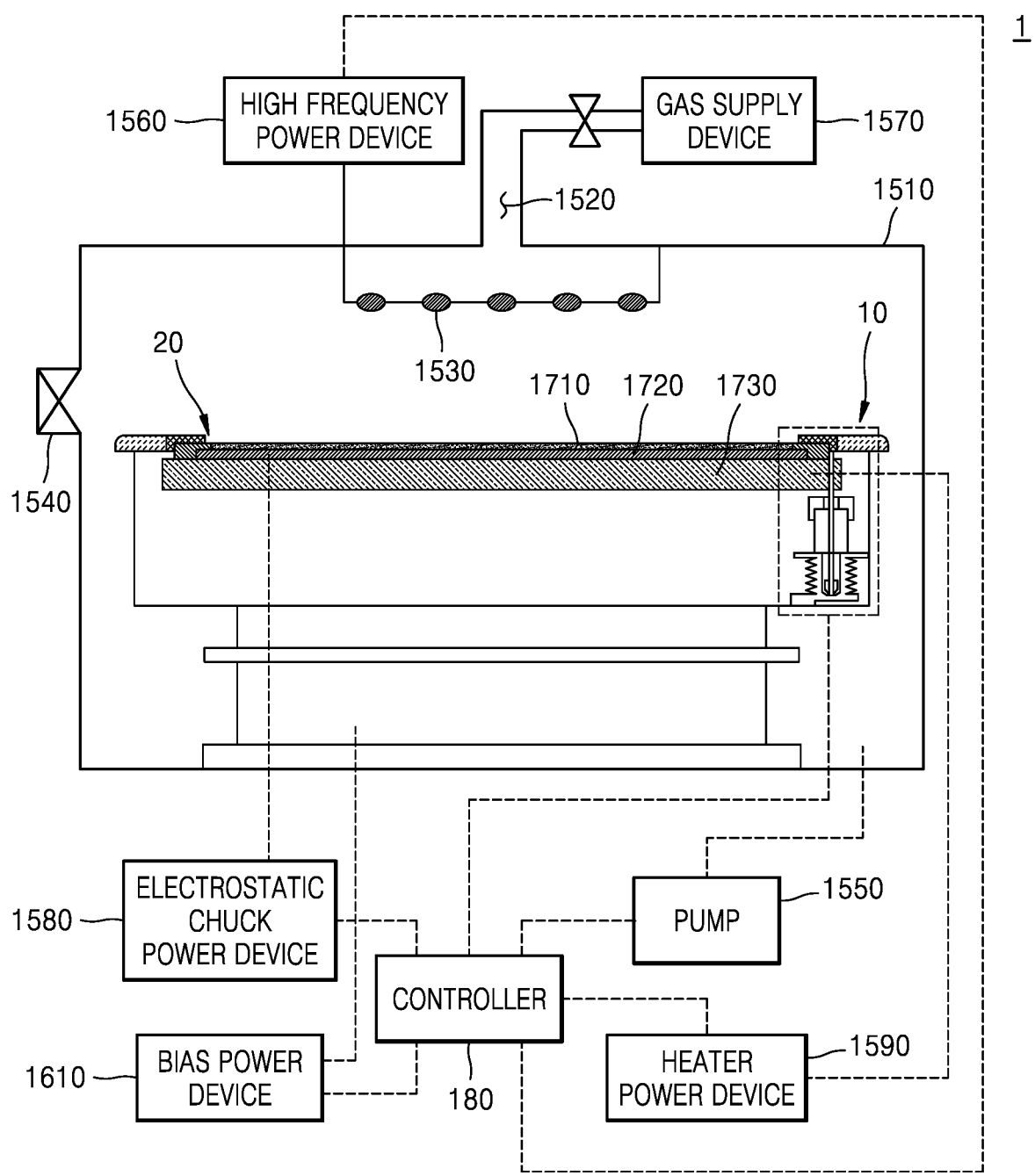
FIG. 15 is a cross-sectional view of a substrate processing apparatus according to a non-limiting example embodiment of the present disclosure.

FIG. 1 is a cross-sectional view of a first lift apparatus 10a (e.g. a lift) according to a non-limiting example embodiment of the present disclosure. The first lift apparatus 10a may move an object L up and down in a substrate processing apparatus 1 (FIG. 15).

In a non-limiting example embodiment, the object L moved by the first lift apparatus 10a up and down may be a substrate including a wafer and a printed circuit board (PCB). The first lift apparatus 10a may move the substrate up and down in order to settle or deviate the substrate on or from an electrostatic chuck 20 (FIG. 15) of the substrate and to take the substrate in or out of a process chamber 1510 (FIG. 15).

In addition, the object L moved by the first lift apparatus 10a up and down may be a movable ring. A shape of plasma generated in a substrate processing process may change based on vertical displacement of the movable ring. In more detail, when a part of the movable ring is etched by the repetition of the substrate processing process so that the shape of plasma generated by the substrate processing process is different from a predicted shape, the first lift apparatus 10a may move the movable ring up and down. Therefore, plasma may have the predicted shape in the substrate processing process.

The first lift apparatus 10a according to a non-limiting example embodiment of the present disclosure may include a body 110, a lift pin 120, a pin guide 130, a bellows 140, a connection assembly 150 (e.g. a connector), a load sensor 160, an actuator 170, and a controller 180.

The body 110 may support the above-described object L. For example, the object L may be settled on an upper surface of the body 110. In addition, a lift hole H1 may be formed in the body 110 and the object L may overlap the lift hole H1 in a vertical direction. In a non-limiting example embodiment, the body 110 may surround the electrostatic chuck 20 (FIG. 15) to be mentioned later.

The lift pin 120 may move the object L settled on the body 110 up and down. In more detail, the lift pin 120 may move the object L up and down by moving in the lift hole H1 of the body 110 up and down.

The pin guide 130 may be positioned in the lift hole H1 of the body 110 and may guide up and down movement of the lift pin 120. An internal surface of the pin guide 130 may be spaced apart from an external surface of the lift pin 120 by a certain distance.

The bellows 140 may be combined with a lower portion of the body 110 and may distinguish a vacuum state into an atmospheric pressure state. The vacuum state may include a state in which the air does not exist and a low pressure state in which pressure of the air is no more than $\frac{1}{1000}$ mmHg. In a non-limiting example embodiment, the bellows 140 may set the lift hole H1 above the bellows 140 to be in the vacuum state and may set a space adjacent to the load sensor 160 to be in the atmospheric pressure state.

In a non-limiting example embodiment, the bellows 140 may include an upper flange 141, a lower flange 143, and a flexible pipe 145. The upper flange 141 may be combined with the lower portion of the body 110 and may expose the lift hole H1. The lower flange 143 may be spaced apart from the upper flange 141 in the vertical direction and may be combined with the actuator 170.

In a non-limiting example embodiment, the flexible pipe 145 may be an elastic pipe formed to be interposed between the upper flange 141 and the lower flange 143 and to surround at least a part of the lift pin 120. The flexible pipe 145 may be tensioned or compressed in accordance with movement of the actuator 170. For example, as the actuator 170 moves downward, the flexible pipe 145 may be tensioned and, as the actuator 170 moves upward, the flexible pipe 145 may be compressed.

The connection assembly 150 may be combined with a lower portion of the lift pin 120. In addition, the connection assembly 150 may be in the bellows 140. In more detail, connection assembly 150 may be interposed between the lift pin 120 and the load sensor 160 in the flexible pipe 145 of the bellows 140.

In a non-limiting example embodiment, the connection assembly 150 may interfere with downward movement of the lift pin 120. However, the connection assembly 150 may not interfere with at least one driving of rotation about a first axis that extends in a direction parallel with a direction in which the lift pin 120 extends, tilting about the first axis, and sliding on a plane perpendicular to the first axis. That is, the connection assembly 150 may limit downward movement of the lift pin 120 and may allow at least one of rotation, tilting, and sliding of the lift pin 120.

In a non-limiting example embodiment, the connection assembly 150 may not interfere with the rotation of the lift pin 120 about the first axis, the tilting of the lift pin 120 about the first axis, and the sliding of the lift pin 120 on the plane perpendicular to the first axis.

Due to manufacturing tolerances and assembly tolerances of components included in a comparative lift apparatus, it is difficult for a lift pin to precisely move only up and down. The lift pin may rotate at a certain angle about the first axis, may be tilted at a certain angle about the first axis, or may slide by a certain displacement on the plane perpendicular to the first axis while moving up and down.

When the rotation, tilting, and sliding of a lift pin are interfered with by a comparative connection assembly combined with the lower portion of the lift pin, due to friction generated between the lift pin and components included in the lift apparatus, the lift pin may be physically damaged.

In addition, when the rotation, tilting, and sliding of the lift pin are interfered with by the comparative connection assembly combined with the lower portion of the lift pin, the lift pin may transmit not only vertical load but also additionally generated load (for example, load generated by the rotation, tilting, and sliding of the lift pin) to a load sensor. Therefore, it may be difficult for the load sensor to precisely measure the vertical load applied to the object.

Since the connection assembly 150 according to a non-limiting example embodiment of the present disclosure may interfere with downward movement of the lift pin 120, however, may not interfere with the rotation, tilting, and sliding of the lift pin 120, it is possible to prevent the lift pin 120 from being physically damaged. In addition, since the lift pin 120 may transmit only vertical load to the load sensor 160, the load sensor 160 may precisely measure vertical load applied to the object L. A combination structure and operation of the connection assembly 150 according to a non-limiting example embodiment of the present disclosure will be described in detail with reference to FIGS. 8 to 14.

The load sensor 160 may be under the connection assembly 150. The load sensor 160 may measure load generated in accordance with up and down movement of the lift pin 120. In more detail, the load sensor 160 may accommodate the load generated in accordance with the up and down movement of the lift pin 120 and may change the load into an electrical signal. The load sensor 160 may generate load information in accordance with a vertical displacement of the lift pin 120 and may transmit the load information to the controller 180.

In a non-limiting example embodiment, the load sensor 160 may include at least one of a strain gauge load cell, a beam load cell, a platform load cell, and a canister load cell. The present disclosure is not limited thereto. The load sensor 160 may include various kinds of sensors capable of changing the load generated in accordance with the up and down movement of the lift pin 120 into the electrical signal.

As described above, according to a non-limiting example embodiment, the connection assembly 150 may not interfere with the rotation, tilting, and sliding of the lift pin 120. Therefore, the lift pin 120 may transmit only the vertical load generated in accordance with the up and down movement of the lift pin 120 to the load sensor 160 and the load sensor 160 may change only the vertical load transmitted from the lift pin 120 into the electrical signal.

The actuator 170 may be under the bellows 140. In more detail, the actuator 170 may be under the lower flange 143 of the bellows 140. The actuator 170 may move the lift pin 120 up and down.

In a non-limiting example embodiment, the actuator 170 may be moved up and down by a power member such as a motor or a hydraulic system. The actuator 170 may move the lift pin 120 in the same direction as a movement direction of the actuator 170.

In a non-limiting example embodiment, as the actuator 170 moves up and down, the flexible pipe 145 of the bellows 140 may be tensioned or compressed. For example, when the actuator 170 moves downward, the flexible pipe 145 may be tensioned. In addition, when the actuator 170 moves upward, the flexible pipe 145 may be compressed.

The controller 180 may entirely control the up and down movement of the object L by using the first lift apparatus 10a. In a non-limiting example embodiment, the controller 180 may be connected to the load sensor 160 and the actuator 170. The controller 180 may determine the load applied to the object L based on the load information generated by the load sensor 160. For example, when the object L moved by the lift pin 120 up and down is a substrate, in a case in which the controller 180 determines that the load applied by the lift pin 120 to the substrate is excessive, the controller 180 may control the actuator 170 and may change an up and down position of the lift pin 120.

In a non-limiting example embodiment, the controller 180 may determine a contact initiation point CP (FIG. 3) between the object L and the lift pin 120 based on the load information generated by the load sensor 160. The contact initiation point CP may be defined as a vertical position of the lift pin 120 immediately before contact between the object L and the lift pin 120 starts and the object L moves upward.

In a non-limiting example embodiment, when the object L moved by the lift pin 120 vertically is a movable ring, the controller 180 may determine the contact initiation point CP between the movable ring and the lift pin 120 based on a magnitude of load measured by the load sensor 160.

In a non-limiting example embodiment, the controller 180 may be implemented by hardware, firmware, software, or an arbitrary combination of hardware, firmware, and software. For example, the controller 180 may be a computing device such as a workstation computer, a desktop computer, a laptop computer, or a tablet computer. The controller 180 may be a simple controller, a complicated processor such as a microprocessor, a central processing unit (CPU), or a graphics processing unit (GPU), a processor formed of software, dedicated hardware, or firmware. The controller 180 may be implemented by a general purpose computer or application specific hardware such as a digital signal processor (DSP), a field programmable gate array (FPGA), or an application specific integrated circuit (ASIC).

In a non-limiting example embodiment, an operation of the controller 180 may be implemented by instructions stored in a machine-readable medium that may be read and executed by one or more processors. Here, the machine-readable medium may include an arbitrary mechanism for storing and/or transmitting information to be readable by a machine (for example, the computing device). For example, the machine-readable medium may include read only memory (ROM), random access memory (RAM), a magnetic disk storage medium, an optical storage medium, flash memory devices, electrical, optical, acoustic, or another type of radio signal (for example, a carrier signal, an Infrared signal, or a digital signal), and other arbitrary signals.

The controller 180 may be implemented by firmware, software, a routine, and instructions for performing up and down movement of the object L by the lift pin 120. For example, the controller 180 may be implemented by software for receiving data for feedback, generating a signal for movement of the object L by the lift pin 120, and performing a prescribed operation.

Since the first lift apparatus 10*a* according to a non-limiting example embodiment of the present disclosure may include the connection assembly 150 that does not interfere with at least one of the rotation, sliding, and tilting of the lift pin 120 and the load sensor 160 that measures vertical load generated in accordance with the movement of the lift pin 120, the first lift apparatus 10*a* may precisely measure the vertical load applied to the object L.

Since the first lift apparatus 10*a* according to the non-limiting example embodiment of the present disclosure may include the connection assembly 150 and the load sensor 160, without setting the inside of the process chamber 1510 (FIG. 15) to be in the atmospheric pressure state, the contact initiation point CP between the object L and the lift pin 120 may be determined.

Since the first lift apparatus 10*a* according to a non-limiting example embodiment of the present disclosure may include the above-described connection assembly 150 and load sensor 160, the first lift apparatus 10*a* may measure the load applied to the object L in real time and may control the lift pin 120 in real time.

Figure 2:
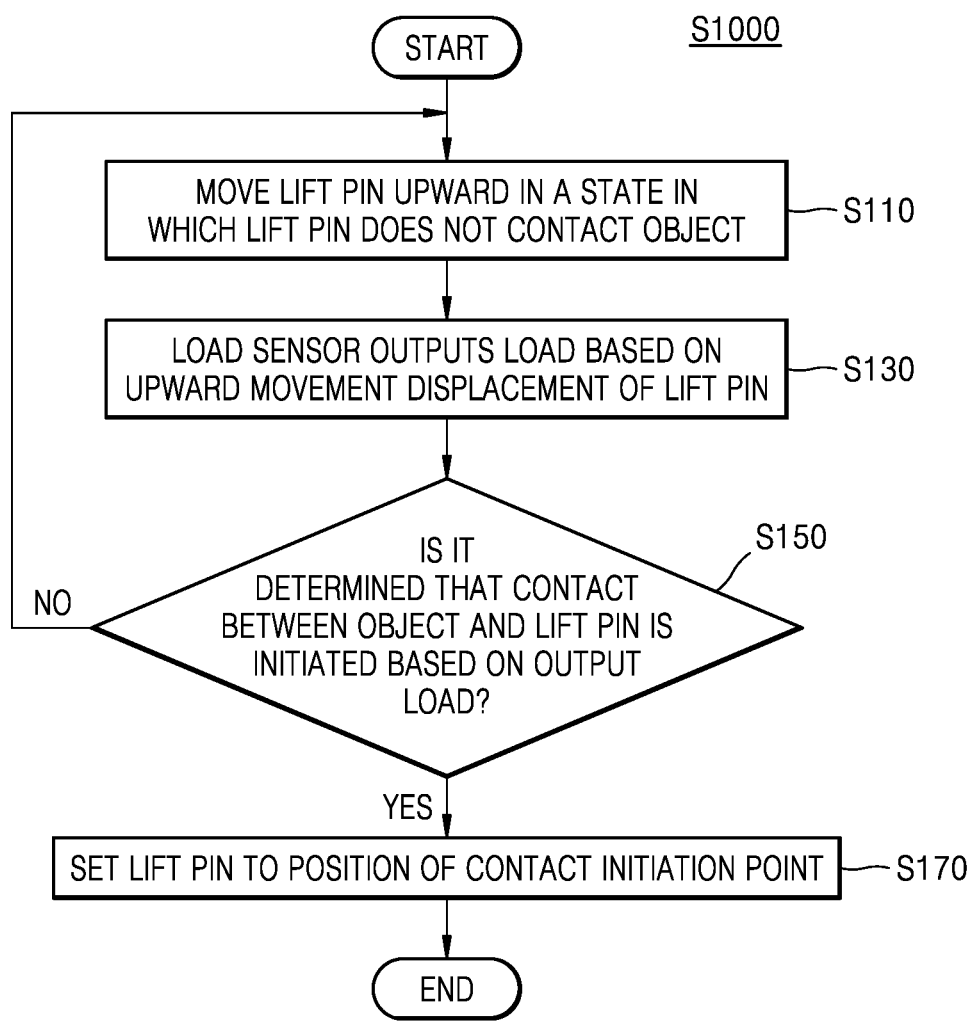
FIG. 2 is a flowchart illustrating a method of determining a contact initiation point between an object and a lift pin by using the first lift apparatus, according to a non-limiting example embodiment of the present disclosure.
Figure 3:
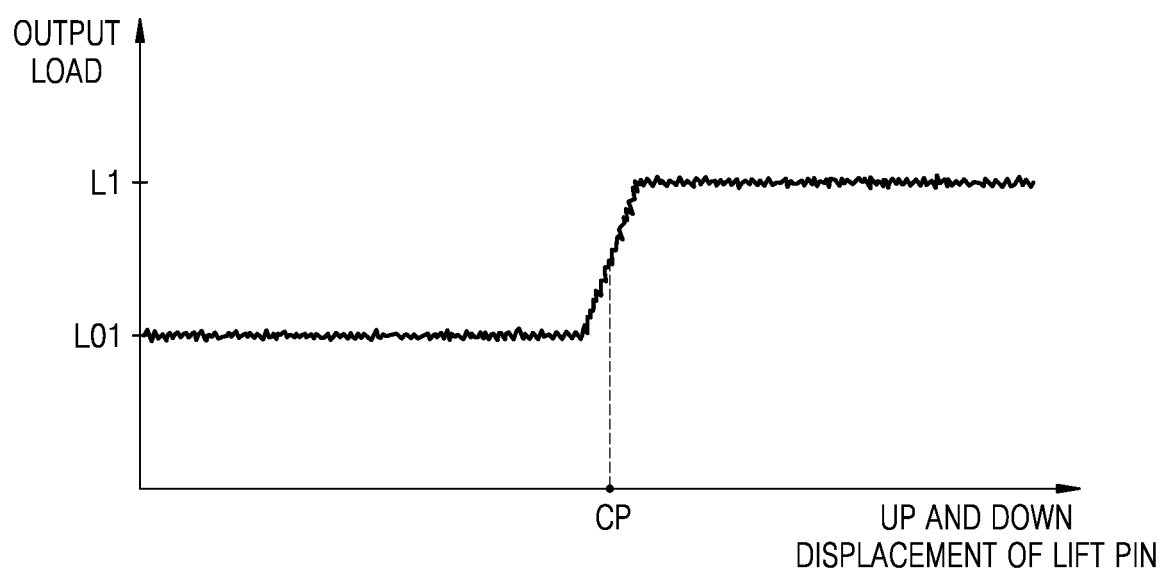
FIG. 3 is a graph illustrating a magnitude of load output from a load sensor based on a vertical displacement of the lift pin of the first lift apparatus according to a non-limiting example embodiment of the present disclosure.

FIG. 2 is a flowchart illustrating a method S1000 of determining the contact initiation point CP between the object L and the lift pin 120 by using the first lift apparatus 10*a* according to a non-limiting example embodiment of the present disclosure. FIG. 3 is a graph illustrating a magnitude of load output from the load sensor 160 based on a vertical displacement of the lift pin 120 of the first lift apparatus 10*a* according to a non-limiting example embodiment of the present disclosure. Hereinafter, the method S1000 of determining the contact initiation point CP between the object L and the lift pin 120 by using the first lift apparatus 10*a* will be described in detail.

The method S1000 of determining the contact initiation point CP between the object L and the lift pin 120 by using the first lift apparatus 10*a* according to a non-limiting example embodiment of the present disclosure may include operation S110 of moving the lift pin 120 upward, operation S130 of the load sensor 160 outputting the load based on the upward displacement of the lift pin 120, operation S150 of determining whether the contact between the object L and the lift pin 120 is initiated based on the output load, and operation S170 of setting the lift pin 120 to a position of the contact initiation point CP.

Referring to FIGS. 1 to 3, in a non-limiting example embodiment, in operation S110, in a state in which the lift pin 120 does not contact the object L, the lift pin 120 may be moved upward by using the actuator 170.

In a non-limiting example embodiment, in operation S130, when the lift pin 120 is moved upward in the state in which the lift pin 120 does not contact the object L, the load sensor 160 may output load having a magnitude similar to that of first reference load L01. The first reference load L01 may include load of the lift pin 120 and the connection assembly 150 and total pressure generated by pressure in the bellows 140. Before the lift pin 120 contacts the object L, although the upward displacement of the lift pin 120 increases, the load sensor 160 may continuously output the load having the magnitude similar to that of the first reference load L01.

In a non-limiting example embodiment, in operation S130, when the lift pin 120 is moved upward in a state in which the lift pin 120 contacts the object L, the load sensor 160 may output first contact load L1 having a magnitude greater than that of the first reference load L01. The first contact load L1 may further include load generated by the contact between the lift pin 120 and the object L. After the lift pin 120 contacts the object L, although the upward displacement of the lift pin 120 increases, the load sensor 160 may continuously output load having a magnitude similar to that of the first contact load L1.

In a non-limiting example embodiment, in operation S150, the controller 180 may determine whether the contact between the object L and the lift pin 120 is initiated based on the load information transmitted by the load sensor 160. In more detail, the controller 180 may determine a vertical position of the lift pin 120 at a point in time at which the magnitude of the load output from the load sensor 160 rapidly increases (that is, a point in time at which the magnitude of the load output from the load sensor 160 increases from the magnitude of the first reference load L01 to the magnitude of the first contact load L1) as the contact initiation point CP.

In a non-limiting example embodiment, in operation S150, when the controller 180 determines that the contact between the object L and the lift pin 120 is not initiated (NO), the controller 180 may move the lift pin 120 upward by controlling the actuator 170. In addition, the load sensor 160 may output the load based on the upward displacement of the lift pin 120.

In addition, in operation S150, when the controller 180 determines that the contact between the object L and the lift pin 120 is initiated (YES), operation S170 may be performed. In more detail, when the controller 180 determines that the contact between the object L and the lift pin 120 is initiated, the controller 180 may control the actuator 170 so that the lift pin 120 is in the position of the contact initiation point CP.

As described above, the first lift apparatus 10*a* according to a non-limiting example embodiment of the present disclosure may include the load sensor 160 in the bellows 140. Although the flexible pipe 145 of the bellows 140 is tensioned or compressed in accordance with up and down movement of the actuator 170, the load sensor 160 may not output load generated by elasticity of the flexible pipe 145. Since the load sensor 160 may exclude the load generated by the elasticity of the flexible pipe 145, the controller 180 may precisely calculate the vertical load applied to the object L.

In addition, since the first lift apparatus 10*a* according to a non-limiting example embodiment of the present disclosure may include the connection assembly 150 that interferes with downward movement of the lift pin 120 and does not interfere with at least one of the rotation, sliding, and tilting of the lift pin 120, the load sensor 160 may measure only the load generated by the up and down movement of the lift pin 120.

In a non-limiting example embodiment, the lift pin 120 may move the object L downward. The controller 180 may determine a separation initiation point between the object L and the lift pin 120 based on the load information generated by the load sensor 160. For example, the controller 180 may determine a vertical position of the lift pin 120 at a point in time at which the magnitude of the load output from the load sensor 160 rapidly decreases as the separation initiation point.

Figure 4:
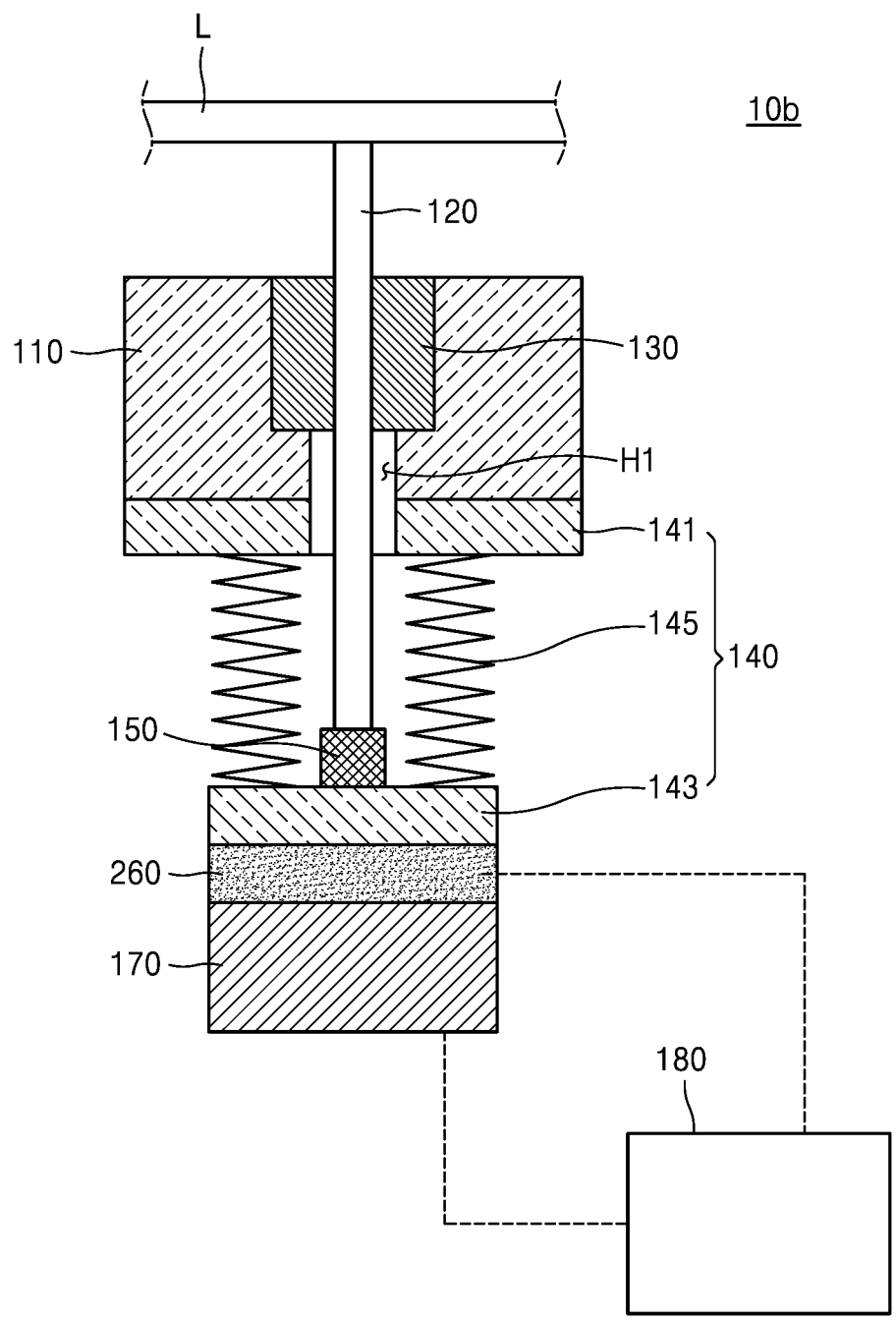
FIG. 4 is a cross-sectional view of a second lift apparatus according to a non-limiting example embodiment of the present disclosure.

FIG. 4 is a cross-sectional view of a second lift apparatus 10b (e.g. a lift) according to a non-limiting example embodiment of the present disclosure. The second lift apparatus 10b may include a body 110, a lift pin 120, a pin guide 130, a bellows 140, a connection assembly 150, a load sensor 260, an actuator 170, and a controller 180. Hereinafter, description previously given of the first lift apparatus 10a will not be given and description of a difference between the first lift apparatus 10a and the second lift apparatus 10b will be mainly given.

Referring to FIG. 4, the load sensor 260 of the second lift apparatus 10b may be outside the bellows 140. In more detail, the load sensor 260 may be interposed between the lower flange 143 of the bellows 140 and the actuator 170.

In a non-limiting example embodiment, since the load sensor 260 may be in a lower portion of the bellows 140, when the bellows 140 is tensioned or compressed by the up and down movement of the actuator 170, the load sensor 260 may additionally measure load generated by elasticity of the bellows 140.

Figure 5:
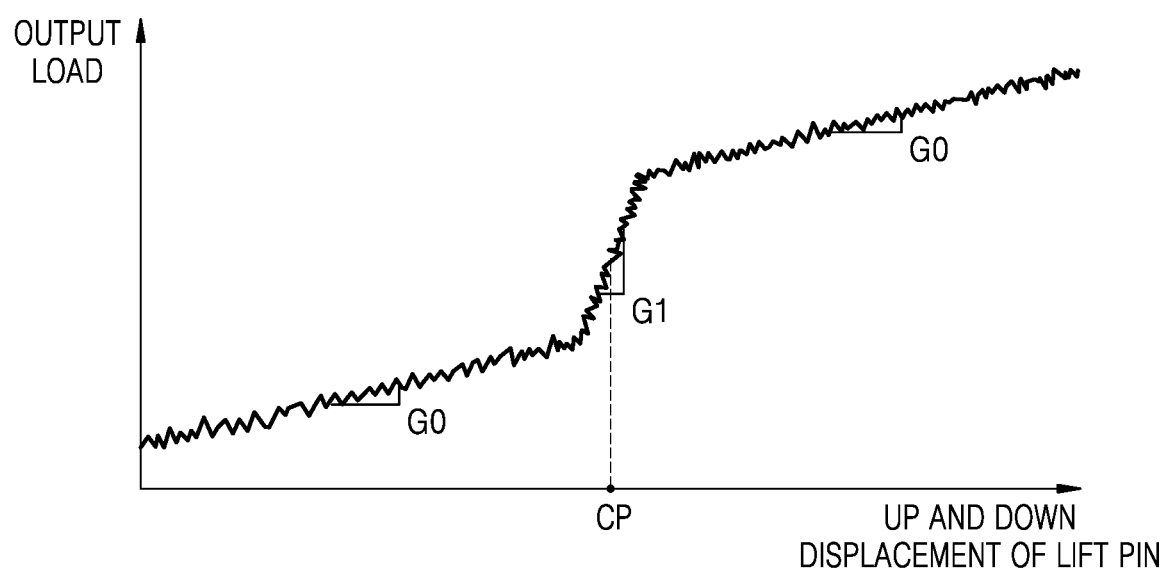
FIG. 5 is a graph illustrating a magnitude of load output from a load sensor based on vertical displacement of a lift pin of the second lift apparatus according to a non-limiting example embodiment of the present disclosure.

FIG. 5 is a graph illustrating the magnitude of the load output from the load sensor 260 based on the vertical displacement of the lift pin 120 of the second lift apparatus 10b according to a non-limiting example embodiment of the present disclosure. The load output from the load sensor 260 of the second lift apparatus 10b may include load of the lift pin 120, the connection assembly 150, and the object L, total pressure generated by pressure in the bellows 140, and elasticity generated by tension or compression of the bellows 140.

Referring to FIG. 5, when the lift pin 120 of the second lift apparatus 10b is moved upward in a state in which the lift pin 120 of the second lift apparatus 10b does not contact the object L, the load sensor 260 may output load that increases in proportion to the upward moving displacement of the lift pin 120 with a reference load gradient G0.

The reference load gradient G0 may be substantially equal to a spring constant value of the flexible pipe 145 of the bellows 140. Before the lift pin 120 contacts the object L, as the upward moving displacement of the lift pin 120 increases, the load sensor 260 may output the load that increases in proportion to the upward moving displacement of the lift pin 120 with the reference load gradient G0.

In addition, when the lift pin 120 of the second lift apparatus 10b is moved upward in the state in which the lift pin 120 of the second lift apparatus 10b contacts the object L, the load sensor 260 may output the load that increases in proportion to the upward moving displacement of the lift pin 120 with the reference load gradient G0.

In a non-limiting example embodiment, at a moment at which the lift pin 120 contacts the object L, the magnitude of the load output by the load sensor 260 may be rapidly increased. In addition, at the moment at which the lift pin 120 contacts the object L, a contact initiation load gradient G1 that is a gradient of the load output from the load sensor 260 may have a value greater than that of the above-described reference load gradient G0.

In a non-limiting example embodiment, the controller 180 may determine whether the contact between the object L and the lift pin 120 is initiated based on the magnitude of the load output from the load sensor 260. In more detail, the controller 180 may determine the vertical position of the lift pin 120 at a point in time at which the magnitude of the load output from the load sensor 260 rapidly increases (that is, a point in time at which the contact initiation load gradient G1 is formed) as the contact initiation point CP.

Since the second lift apparatus 10b according to a non-limiting example embodiment of the present disclosure may include the connection assembly 150 that interferes with the downward movement of the lift pin 120 and does not interfere with at least one of the rotation, sliding, and tilting of the lift pin 120, the load sensor 260 may output only the load generated by the up and down movement of the lift pin 120.

Figure 6:
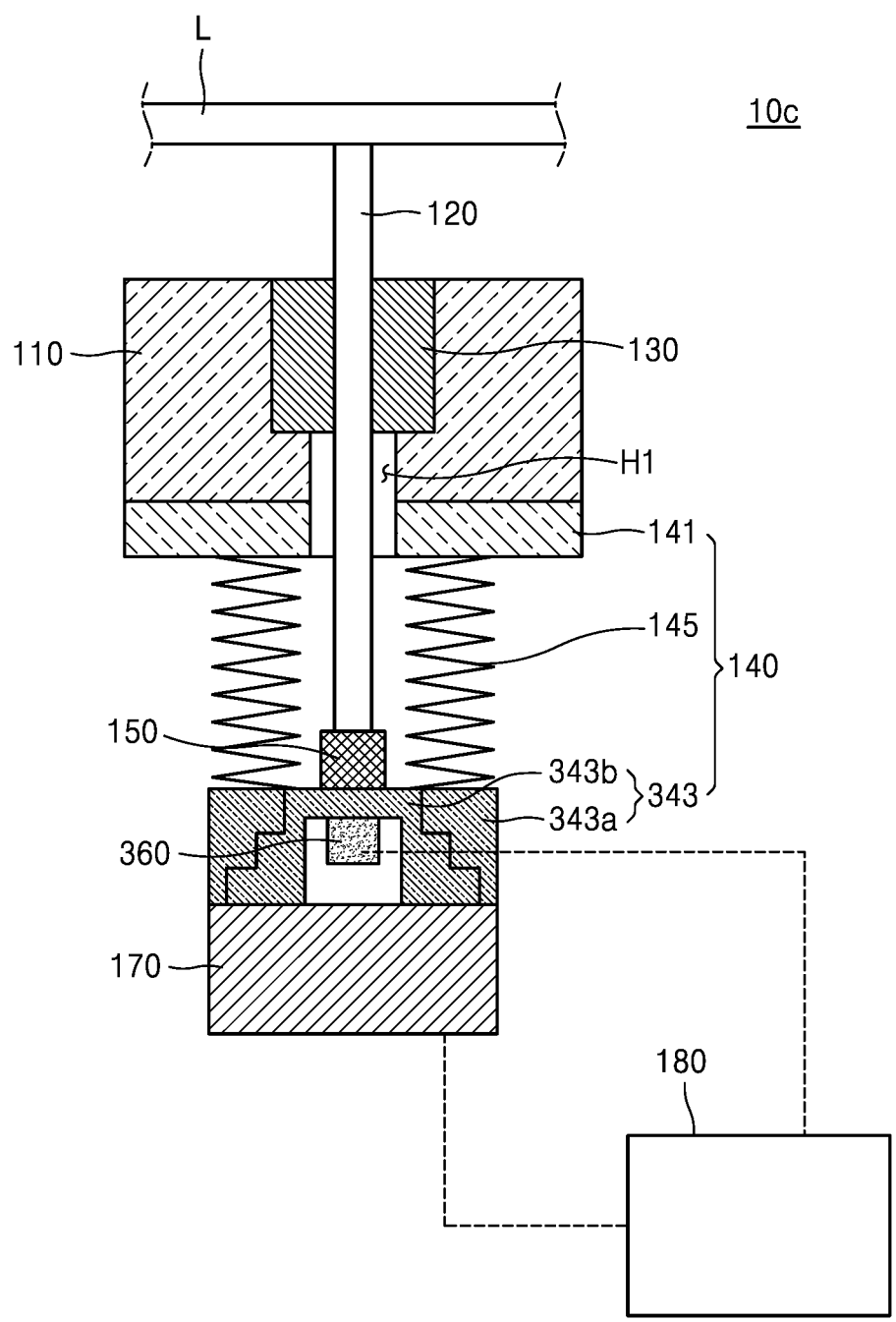
FIG. 6 is a cross-sectional view of a third lift apparatus according to a non-limiting example embodiment of the present disclosure.

FIG. 6 is a cross-sectional view of a third lift apparatus 10c (e.g. a lift) according to a non-limiting example embodiment of the present disclosure. The third lift apparatus 10c may include a body 110, a lift pin 120, a pin guide 130, a bellows 140, a connection assembly 150, a load sensor 360, an actuator 170, and a controller 180. Hereinafter, description previously given of the first lift apparatus 10a will not be given and description of a difference between the first lift apparatus 10a and the third lift apparatus 10c will be mainly given.

Referring to FIG. 6, a lower flange 343 of the bellows 140 of the third lift apparatus 10c may include a mounting portion 343a (e.g. a mounting body) and a deformable portion 343b (e.g. a deformable body). In a non-limiting example embodiment, the mounting portion 343a may be a part of the lower flange 343 settled on the actuator 170 and combined with the flexible pipe 145.

In a non-limiting example embodiment, the deformable portion 343b may be a part of the lower flange 343 combined with the connection assembly 150 in the mounting portion 343a. In addition, the deformable portion 343b may be formed of a material deformed by external force and may be physically deformed by the up and down movement of the lift pin 120 or pressure in the flexible pipe 145. For example, the deformable portion 343b may be bent by the up and down movement of the lift pin 120 or the pressure in the flexible pipe 145.

In more detail, when downward external force is applied to the deformable portion 343b due to the contact between the object L and the lift pin 120, the deformable portion 343b may be bent downward. In addition, when the inside of the bellows 140 is set to be in the vacuum state, the deformable portion 343b may be bent upward.

In a non-limiting example embodiment, the load sensor 360 may be combined with a lower portion of the deformable portion 343b. The load sensor 360 may measure the load in accordance with the vertical displacement of the lift pin 120 and may generate load information based on a degree of deformity of the deformable portion 343b (for example, a degree to which the deformable portion 343b is bent).

The lower flange 343 of the third lift apparatus 10c according to a non-limiting example embodiment of the present disclosure may include the deformable portion 343b bent in accordance with an external environment. Therefore, although the flexible pipe 145 of the bellows 140 is tensioned or compressed in accordance with the up and down movement of the actuator 170, the load sensor 360 combined with the lower portion of the deformable portion 343b may not output the load generated by the elasticity of the flexible pipe 145. Since the load sensor 360 may exclude the load generated by the elasticity of the flexible pipe 145, the controller 180 may precisely determine the magnitude of the load applied to the object L.

In addition, since the load sensor 360 of the third lift apparatus 10c according to a non-limiting example embodiment of the present disclosure may be outside the bellows 140, the load sensor 360 may be easily managed without being affected by an internal environment of the bellows 140.

Figure 7:
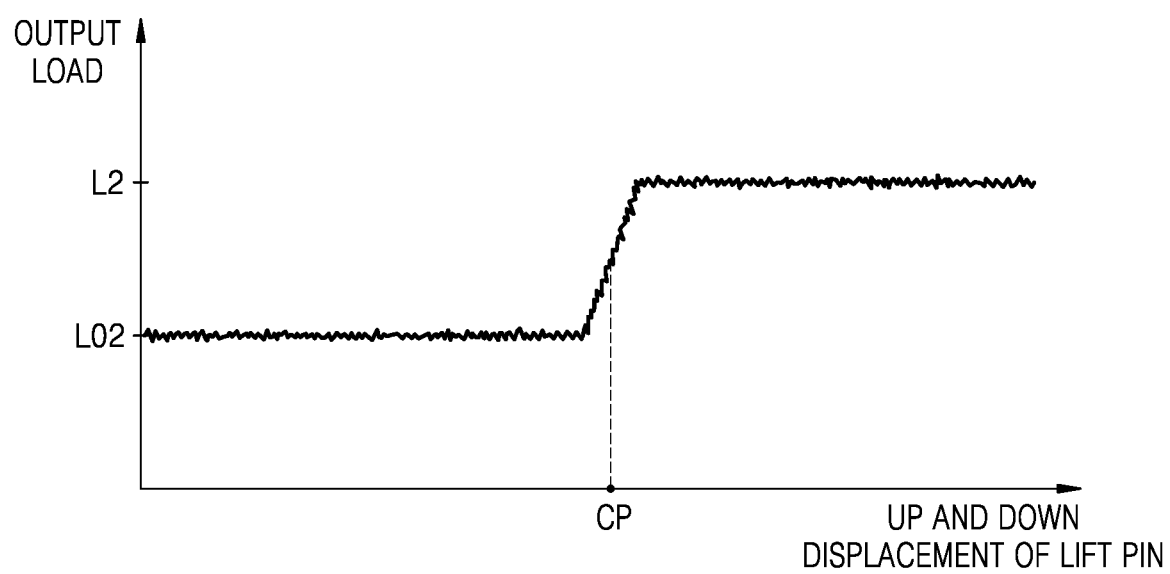
FIG. 7 is a graph illustrating a magnitude of load output from a load sensor based on a vertical displacement of a lift pin of a third lift apparatus according to a non-limiting example embodiment of the present disclosure.

FIG. 7 is a graph illustrating the magnitude of the load output from the load sensor 360 based on the vertical displacement of the lift pin 120 of the third lift apparatus 10c according to a non-limiting example embodiment of the present disclosure. The load output from the load sensor 360 of the third lift apparatus 10c may include the load of the lift pin 120, the connection assembly 150, and the object L and total pressure generated by pressure in the bellows 140.

Referring to FIG. 7, when the lift pin 120 is moved upward in the state in which the lift pin 120 does not contact the object L, the load sensor 360 may output load having a magnitude similar to that of second reference load L02. The second reference load L02 may include the load of the lift pin 120 and the connection assembly 150 and the total pressure generated by the pressure in the bellows 140. Before the lift pin 120 contacts the object L, although the upward displacement of the lift pin 120 increases, the load sensor 360 may continuously output the load having the magnitude similar to that of the second reference load L02.

In a non-limiting example embodiment, when the lift pin 120 is moved upward in the state in which the lift pin 120 contacts the object L, the load sensor 360 may output second contact load L2 having a magnitude greater than that of the second reference load L02. The second contact load L2 may include the load generated by the contact between the lift pin 120 and the object L. After the lift pin 120 contacts the object L, although the upward displacement of the lift pin 120 increases, the load sensor 360 may continuously output the load having the magnitude similar to that of the second contact load L2.

In a non-limiting example embodiment, the controller 180 may determine whether the contact between the object L and the lift pin 120 is initiated based on the load output from the load sensor 360. In more detail, the controller 180 may determine a position of the lift pin 120 at a point in time at which the magnitude of the load output from the load sensor 360 rapidly increases (that is, at a point in time at which the magnitude of the load output from the load sensor 360 increases from the magnitude of the second reference load L02 to the magnitude of the second contact load L2) as the contact initiation point CP.

As described above, the third lift apparatus 10c according to a non-limiting example embodiment of the present disclosure may include the deformable portion 343b bent in accordance with the external environment and the load sensor 360 combined with the deformable portion 343b. Therefore, although the flexible pipe 145 of the bellows 140 is tensioned or compressed in accordance with the up and down movement of the actuator 170, the load sensor 360 may exclude the load generated by the elasticity of the flexible pipe 145.

In addition, since the third lift apparatus 10c according to a non-limiting example embodiment of the present disclosure may include the connection assembly 150 that interferes with downward movement of the lift pin 120 and does not interfere with at least one of the rotation, sliding, and tilting of the lift pin 120, the load sensor 360 may output only the load generated by the up and down movement of the lift pin 120.

Hereinafter, referring to FIGS. 8 to 14, the combination structure and operation of the connection assembly 150 according to non-limiting example embodiments of the present disclosure will be described in detail.

Figure 8:
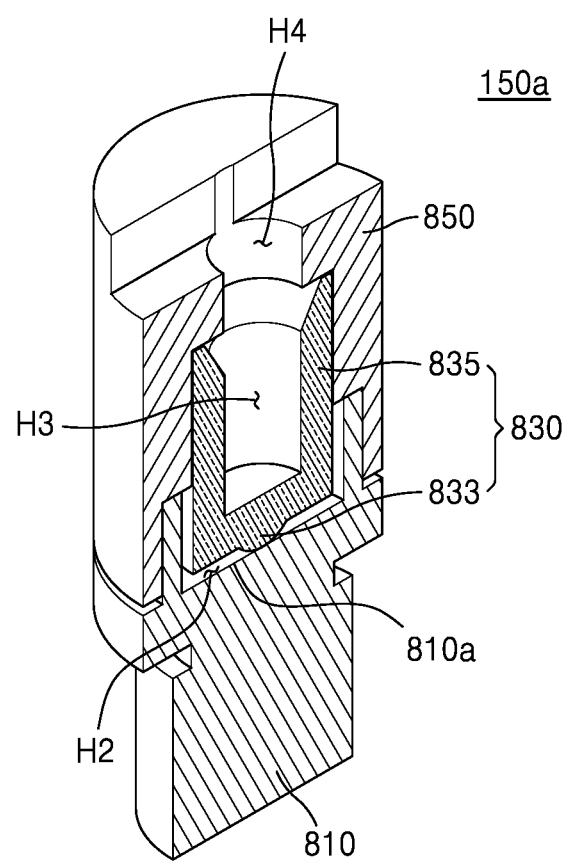
FIG. 8 is a view three-dimensionally illustrating a cross-section of a first connection assembly according to a non-limiting example embodiment of the present disclosure.
Figure 9:
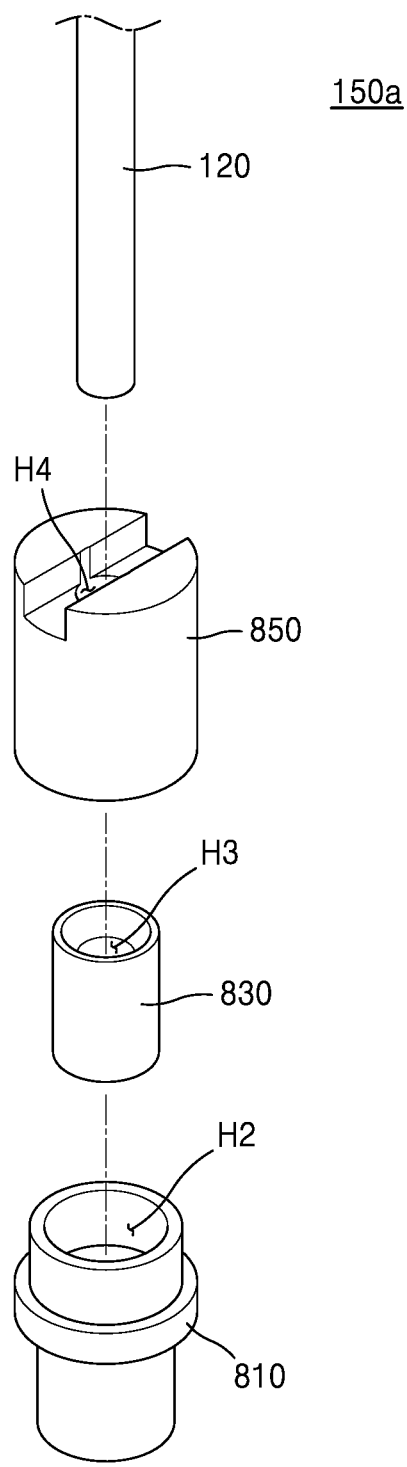
FIG. 9 is a three-dimensional exploded view of the first connection assembly according to a non-limiting example embodiment of the present disclosure.

FIG. 8 is a view three-dimensionally illustrating a cross-section of a first connection assembly 150a (e.g. a connector) according to a non-limiting example embodiment of the present disclosure. FIG. 9 is a three-dimensional exploded view of the first connection assembly 150a according to a non-limiting example embodiment of the present disclosure.

Referring to FIGS. 8 and 9, the first connection assembly 150a may include a lower support 810, a rotating body 830, and an upper support 850. In the lower support 810 of the first connection assembly 150a, a mounting hole H2 for mounting the rotating body 830 may be formed.

The rotating body 830 of the first connection assembly 150a may be positioned in the mounting hole H2. The rotating body 830 may include a contact 833 and a joint 835. The contact 833 may be a curved part of the rotating body 830 that contacts an internal bottom surface 810a of the lower support 810 at one point. In addition, the joint 835 may be a part of the rotating body 830 extending upward from the contact 833 and having a combining hole H3 for fitting the lift pin 120.

The upper support 850 of the first connection assembly 150a may cover the rotating body 830 on the lower support 810. In addition, the first connection assembly 150a may have a through hole H4 through which the lift pin 120 passes.

In a non-limiting example embodiment, the rotating body 830 may rotate about a first axis in a direction parallel with a direction (that is, an up and down direction) in which the lift pin 120 extends in the mounting hole H2 of the lower support 810.

In addition, an external side surface of the rotating body 830 and an internal side surface of the lower support 810 may be spaced apart from each other. The rotating body 830 may be tilted about the first axis in a range allowed by a distance between the external side surface of the rotating body 830 and the internal side surface of the lower support 810. In addition, the rotating body 830 may slide on the internal surface of the lower support 810 in the range allowed by the distance between the external surface of the rotating body 830 and the internal surface of the lower support 810.

The first connection assembly 150a according to a non-limiting example embodiment of the present disclosure may not interfere with the rotation, sliding, and tilting of the rotating body 830 in the range allowed by the distance between the external side surface of the rotating body 830 and the internal side surface of the lower support 810. Therefore, the load sensor 160, the load sensor 260, or the load sensor 360, may precisely measure the vertical load generated in accordance with the movement of the lift pin 120.

Figure 10:
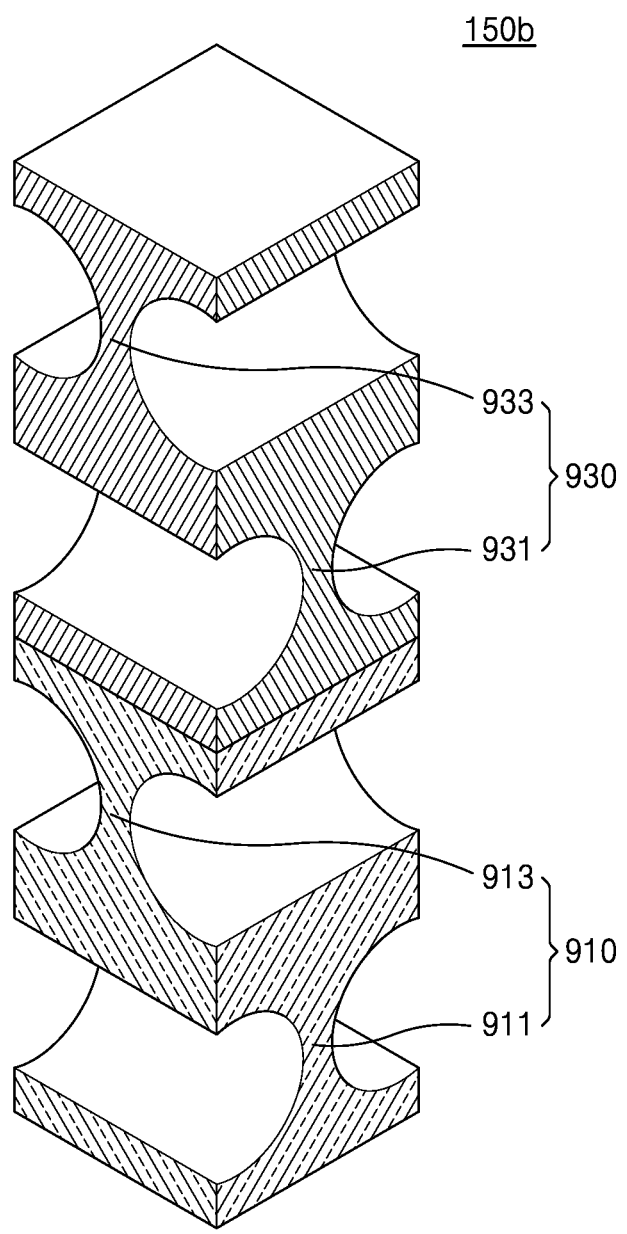
FIG. 10 is a view three-dimensionally illustrating a second connection assembly according to a non-limiting example embodiment of the present disclosure.
Figure 11:
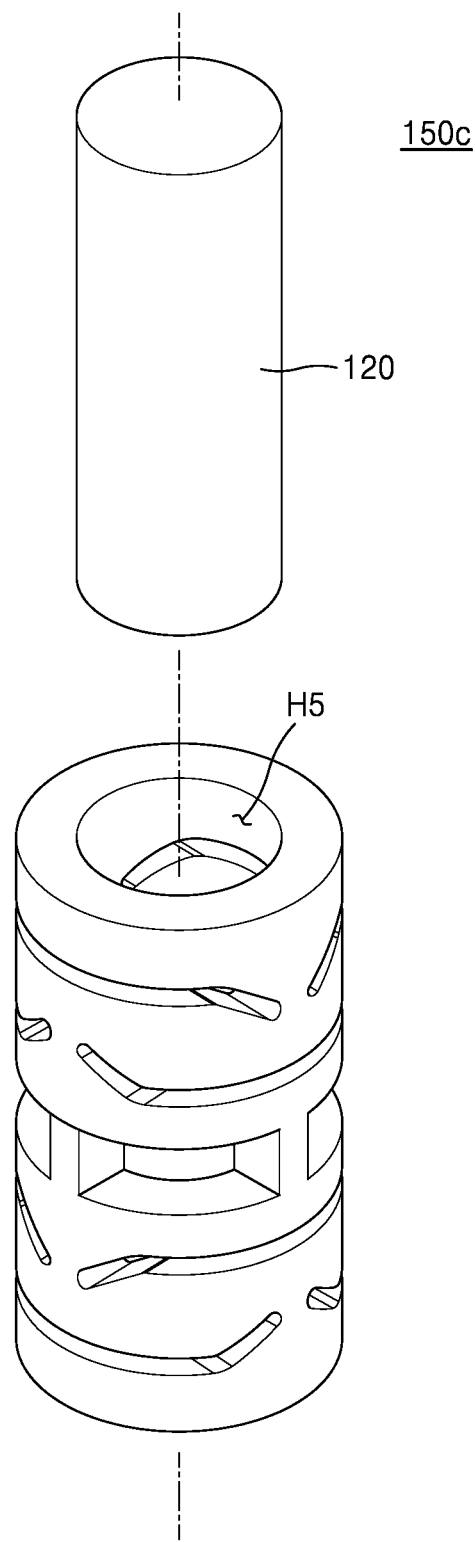
FIG. 11 is a view three-dimensionally illustrating a third connection assembly according to a non-limiting example embodiment of the present disclosure.

FIG. 10 is a view three-dimensionally illustrating a second connection assembly 150b (e.g. a connector) according to a non-limiting example embodiment of the present disclosure. FIG. 11 is a view three-dimensionally illustrating a third connection assembly 150c (e.g. a connector) according to a non-limiting example embodiment of the present disclosure.

Referring to FIG. 10, the second connection assembly 150b may include a first flexure hinge 910 and a second flexure hinge 930. In a non-limiting example embodiment, the first flexure hinge 910 may include a first hinge shaft 911 that extends in a first direction (e.g. first horizontal direction). In addition, the first flexure hinge 910 may include a second hinge shaft 913 provided on the first hinge shaft 911 to extend in a second direction (e.g. second horizontal direction) perpendicular to the first direction. When the first flexure hinge 910 is seen from a flat perspective, the first hinge shaft 911 and the second hinge shaft 913 may intersect in a vertical direction. In an embodiment, the first hinge shaft 911 may be configured to flex in the second direction, and the second hinge shaft 913 may be configured to flex in the first direction.

The second flexure hinge 930 may be combined with the first flexure hinge 910. In addition, the lift pin 120 may be combined with the uppermost portion of the second flexure hinge 930. For example, although not shown in FIG. 10, a groove for fitting the lift pin 120 may be formed in the uppermost portion of the second flexure hinge 930. The present disclosure is not limited thereto. The second flexure hinge 930 may be combined with the lift pin 120 by various methods.

In a non-limiting example embodiment, the second flexure hinge 930 may include a third hinge shaft 931 that extends in the first direction. In addition, the second flexure hinge 930 may include a fourth hinge shaft 933 provided on the third hinge shaft 931 to extend in the second direction. When the second flexure hinge 930 is seen from a flat perspective, the third hinge shaft 931 and the fourth hinge shaft 933 may intersect in a vertical direction. In an embodiment, the third hinge shaft 931 may be configured to flex in the second direction, and the fourth hinge shaft 933 may be configured to flex in the first direction.

In a non-limiting example embodiment, a plurality of flexure hinges may be included in the second connection assembly 150b. For example, the number of flexure hinges included in the second connection assembly 150b may be no less than 3.

In a non-limiting example embodiment, since the second connection assembly 150b may include the first flexure hinge 910 and the second flexure hinge 930, the second connection assembly 150b may rotate or may be tilted about the first direction and the second direction in a range allowed by a structure of the second connection assembly 150b. In addition, since the second connection assembly 150b may include first to fourth hinge shafts 911, 913, 931, and 933, the lift pin 120 combined with the second connection assembly 150b may move by a certain displacement in a horizontal direction.

Referring to FIG. 11, the third connection assembly 150c may be cylindrical. In addition, the third connection assembly 150c may include a combining hole H5 for fitting the lift pin 120 in an upper portion.

In a non-limiting example embodiment, the third connection assembly 150c may include the first flexure hinge 910 and the second flexure hinge 930 described with reference to FIG. 10. For example, the third connection assembly 150c may be a peak beam coupling including the first flexure hinge 910 and the second flexure hinge 930. Since the spirit of an operation of the third connection assembly 150c is similar to that of an operation of the second connection assembly 150b of FIG. 10, detailed description thereof will not be given.

The second connection assembly 150b and the third connection assembly 150c according to a non-limiting example embodiment of the present disclosure may not interfere with the rotation, sliding, and tilting of the lift pin 120. Therefore, the load sensor 160, the load sensor 260, or the load sensor 360 may precisely measure the vertical load generated in accordance with the movement of the lift pin 120.

Figure 12:
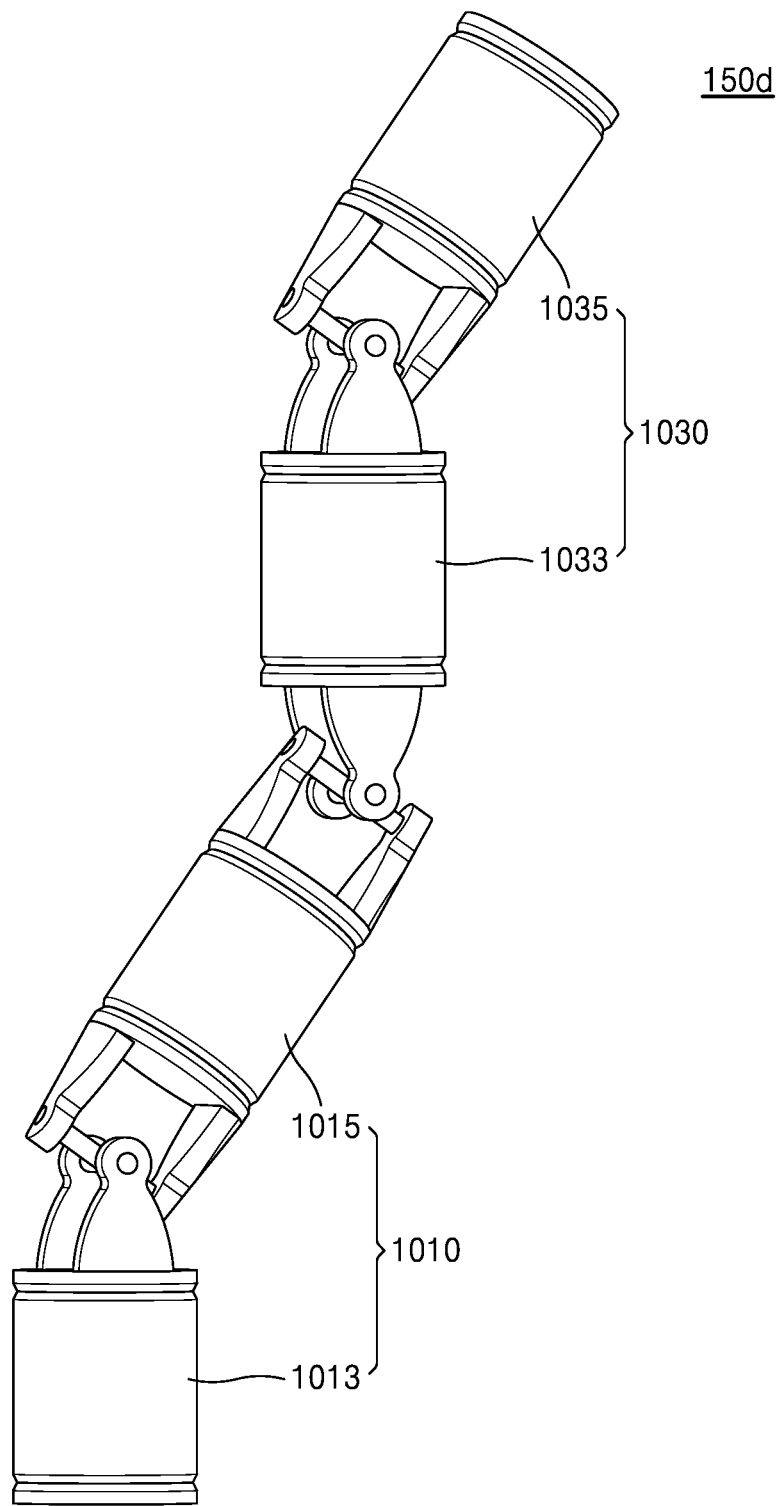
FIG. 12 is a view three-dimensionally illustrating a fourth connection assembly according to a non-limiting example embodiment of the present disclosure.

FIG. 12 is a view three-dimensionally illustrating a fourth connection assembly 150d (e.g. a connector) according to a non-limiting example embodiment of the present disclosure.

Referring to FIG. 12, the fourth connection assembly 150d may include a first universal joint 1010 and a second universal joint 1030. In a non-limiting example embodiment, the first universal joint 1010 and the second universal joint 1030 may be universal couplings combined with each other.

In a non-limiting example embodiment, the first universal joint 1010 may include a first link 1013 and a second link 1015, provided above the first link 1013 and that may be a universal coupling combined with the first link 1013. The second universal joint 1030 may include a third link 1033 and a fourth link 1035, provided above the third link 1033 and that may be a universal coupling combined with the third link 1033. In addition, the second link 1015 of the first universal joint 1010 and the third link 1033 of the second universal joint 1030 may be universal couplings combined with each other.

In FIG. 12, the fourth connection assembly 150d is illustrated as including the first and second universal joints 1010 and 1030. However, the present disclosure is not limited thereto. The fourth connection assembly 150d may include three or more universal joints.

Since the fourth connection assembly 150d may include the first universal joint 1010 and the second universal joint 1030, the fourth connection assembly 150d may rotate about the first axis in a direction parallel with the direction in which the lift pin 120 extends. In addition, the fourth connection assembly 150d may be tilted at a certain angle about the first axis or may slide on the plane perpendicular to the first axis by a certain displacement.

Therefore, the fourth connection assembly 150d may transmit only the load generated in accordance with the up and down movement of the lift pin 120 to the load sensor 160 and the load sensor 160 may precisely measure the load.

Figure 13:
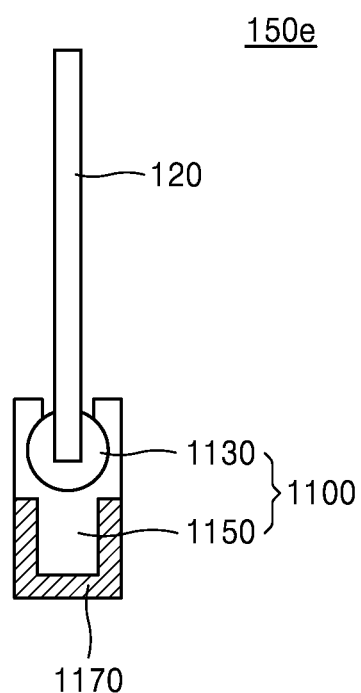
FIG. 13 is a cross-sectional view of a fifth connection assembly according to a non-limiting example embodiment of the present disclosure.

FIG. 13 is a cross-sectional view of a fifth connection assembly 150e (e.g. a connector) according to a non-limiting example embodiment of the present disclosure.

Referring to FIG. 13, the fifth connection assembly 150e may include a ball socket joint 1100. In detail, the ball socket joint 1100 may include a ball-shaped joint ball 1130 combined with the lift pin 120 and a joint socket 1150 accommodating the ball-shaped joint ball 1130 and ball-socket joint combined with the ball-shaped joint ball 1130.

Since the fifth connection assembly 150e may include the ball socket joint 1100, the fifth connection assembly 150e may rotate about the first axis in the direction parallel with the direction in which the lift pin 120 extends and may be tilted about the first axis.

In a non-limiting example embodiment, the fifth connection assembly 150e may further include a slider apparatus 1170. Since the fifth connection assembly 150e may include the slider apparatus 1170, the fifth connection assembly 150e may slide on the plane perpendicular to the first axis by a certain displacement.

In a non-limiting example embodiment of the present disclosure, the fifth connection assembly 150e may not interfere with the rotation, sliding, and tilting of the lift pin 120. Therefore, the load sensor 160, the load sensor 260, or the load sensor 360 may precisely measure the vertical load generated in accordance with the movement of the lift pin 120.

Figure 14:
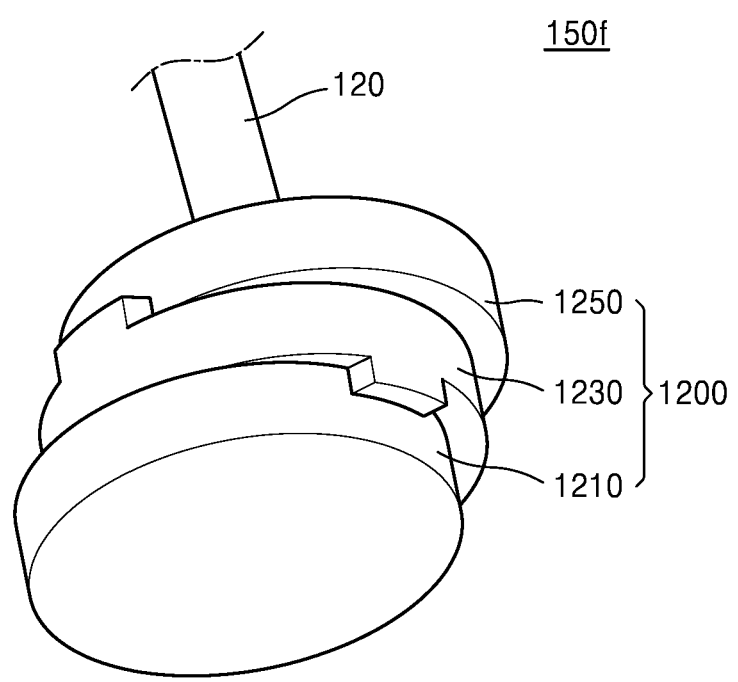
FIG. 14 is a cross-sectional view of a sixth connection assembly according to a non-limiting example embodiment of the present disclosure.

FIG. 14 is a cross-sectional view of a sixth connection assembly 150f (e.g. a connector) according to a non-limiting example embodiment of the present disclosure.

Referring to FIG. 14, the sixth connection assembly 150f may include an Oldham's coupling 1200. The Oldham's coupling 1200 may include a support link 1210, a connection link 1230, and a driving link 1250.

In a non-limiting example embodiment, the support link 1210 may support the connection link 1230 and the driving link 1250 under the connection link 1230 and the driving link 1250.

In a non-limiting example embodiment, the connection link 1230 may be provided between the support link 1210 and the driving link 1250. The connection link 1230 may be tilted at a certain angle about the first axis in the direction parallel with the direction in which the lift pin 120 extends and may slide on the plane perpendicular to the first axis by a certain displacement. In addition, the connection link 1230 may rotate on the support link 1210 about the first axis. The driving link 1250 may be provided on the connection link 1230 and may be combined with the lift pin 120.

Since the sixth connection assembly 150f according to a non-limiting example embodiment of the present disclosure may include the Oldham's coupling 1200, the sixth connection assembly 150f may not interfere with the rotation, sliding, and tilting of the lift pin 120. Therefore, the load sensor 160, the load sensor 260, or the load sensor 360 may precisely measure the vertical load generated in accordance with the movement of the lift pin 120.

FIG. 15 is a cross-sectional view of a substrate processing apparatus 1 according to a non-limiting example embodiment of the present disclosure.

Referring to FIG. 15, the substrate processing apparatus 1 may include an electrostatic chuck 20, a lift apparatus 10, a process chamber 1510, a gas supply pipe 1520, a plasma generating apparatus 1530 (e.g. a plasma generator), a gate 1540, a pump 1550, a high frequency power device 1560, a gas supply device 1570, an electrostatic chuck power device 1580, a heater power device 1590, and a bias power device 1610.

The electrostatic chuck 20 of the substrate processing apparatus 1 may fix a substrate by electrostatic force. The electrostatic chuck 20 may include a chuck plate 1710 on which the substrate is settled, an electrostatic plate 1720 for generating electrostatic force, and a heating plate 1730 for heating the substrate.

The lift apparatus 10 of the substrate processing apparatus 1 may move one of the substrate settled on the electrostatic chuck 20 and a movable ring that surrounds the electrostatic chuck 20 up and down, in addition, the body 110 of the lift apparatus 10 may surround the electrostatic chuck 20. Since the spirit of the lift apparatus 10 is substantially the same as those of the first to third lift apparatuses 10a, 10b, and 10c described with reference to FIGS. 1 to 14, detailed description thereof will not be given.

In a non-limiting example embodiment, the substrate processing apparatus 1 may include a plurality of the lift apparatus 10. In detail, the substrate processing apparatus 1 may include a plurality of the lift pin 120 and a plurality of the load sensor 160 (and/or the load sensor 260 and/or the load sensor 360). The plurality of the lift pin 120 and the plurality of the load sensor 160 (and/or the load sensor 260 and/or the load sensor 360) may be separately controlled by a controller 180.

In a non-limiting example embodiment, the plurality of the lift apparatus 10 may be arranged to be symmetrical with each other from the center of the electrostatic chuck 20 (FIG. 15) For example, when the number of lift apparatuses 10 is 3, the plurality of the lift apparatus 10 may be arranged at intervals of about 120 degrees to be symmetrical with each other from the center of the electrostatic chuck 20.

In a non-limiting example embodiment, a plurality of the load sensor 160 (and/or the load sensor 260 and/or the load sensor 360) may separately measure vertical load generated in accordance with movements of the plurality of the lift pin 120. For example, a first load sensor may measure first vertical load generated in accordance with movement of a first lift pin corresponding to the first load sensor, and a second load sensor may measure second vertical load generated in accordance with movement of a second lift pin corresponding to the second load sensor.

In a non-limiting example embodiment, the controller 180 may separately control the plurality of the lift pin 120 based on the load measured by the plurality of the load sensor 160 (and/or the load sensor 260 and/or the load sensor 360). For example, the controller 180 may control up and down movement of the first lift pin based on the first load measured by the first load sensor and may control up and down movement of the second lift pin based on the second load measured by the second load sensor.

The process chamber 1510 may provide a process space for processing the object L. The electrostatic chuck 20 may be positioned in the process space of the process chamber 1510.

The gas supply pipe 1520 may be connected to the gas supply device 1570. The gas supply pipe 1520 may implant a processing gas provided by the gas supply device 1570 into the process chamber 1510. In a non-limiting example embodiment, when the object L settled on the electrostatic chuck 20 is a substrate, the processing gas may include an etching gas for etching the substrate or a protective gas for protecting patterns formed on the substrate. One or more of the gas supply pipe 1520 and the gas supply device 1570 may be referred to as a processing gas supply.

The gate 1540 may provide a path through which the object L may move. For example, the object L may be taken out of the process chamber 1510 through the gate 1540 or may be taken in the process chamber 1510 through the gate 1540.

The pump 1550 may control internal pressure of the process chamber 1510. For example, the pump 1550 may increase pressure by implanting the air into the process chamber 1510. In addition, the pump 1550 may reduce pressure by discharging the air in the process chamber 1510.

The high frequency power device 1560 may be electrically connected to the plasma generating apparatus 1530. The high frequency power device 1560 may output high frequency power suitable for generating plasma and may transmit the output high frequency power to the plasma generating apparatus 1530. The high frequency power of the high frequency power device 1560 may be controlled by the controller 180.

The electrostatic chuck power device 1580 may be electrically connected to the electrostatic chuck 20, As described above, the electrostatic chuck power device 1580 may be electrically connected to the electrostatic plate 1720 of the electrostatic chuck 20. By power applied by the electrostatic chuck power device 1580, for example, a direct current (DC) voltage, electrostatic force may be generated between the electrostatic plate 1720 and the substrate. The substrate may be firmly settled on the chuck plate 1710 of the electrostatic chuck 20 by the electrostatic force.

The heater power device 1590 may be connected to the heating plate 1730 of the electrostatic chuck 20. The heater power device 1590 may apply power to a plurality of heating elements included in the heating plate 1730.

The bias power device 1610 may apply high frequency power to the electrostatic chuck 20. A lower portion of the electrostatic chuck 20 may function as an electrode for generating plasma.

As described above, the controller 180 may be connected to the lift apparatus 10. In more detail, the controller 180 may be connected to the load sensor 160 (and/or the load sensor 260 and/or the load sensor 360) and may determine at least one of a magnitude of load applied to the object L and the contact initiation point CP between the object L and the lift pin 120 based on the load measured by the load sensor 160 (and/or the load sensor 260 and/or the load sensor 360). In addition, the controller 180 may be connected to the actuator 170. The controller 180 may move the lift pin 120 up and down by driving the actuator 170 based on information on the load measured by the load sensor 160.

In a non-limiting example embodiment, the controller 180 may control at least one of the high frequency power device 1560, the gas supply device 1570, the electrostatic chuck power device 1580, the heater power device 1590, the pump 1550, and the bias power device 1610.

Since the substrate processing apparatus 1 according to the present disclosure may include the lift apparatus 10 described above, the substrate processing apparatus 1 may not interfere with at least one of the rotation, sliding, and tilting of the lift pin 120. Therefore, the substrate processing apparatus 1 may precisely measure the vertical load applied to the object L in a substrate processing process and may prevent the object L from being physically damaged.

Since the substrate processing apparatus 1 according to the present disclosure may include the lift apparatus 10 described above, the contact initiation point CP between the object L and the lift pin 120 may be determined without setting the inside of the process chamber 1510 to be in the atmospheric pressure state.

Since the substrate processing apparatus 1 according to the present disclosure may include the lift apparatus 10 described above, the load applied to the object L may be measured in real time and the lift pin 120 may be controlled in real time based on the measured load.

While aspects of the present disclosure have been particularly shown and described with reference to embodiments thereof, it will be understood that various changes in form and details may be made therein.

What is claimed is:

1. A lift apparatus for moving an object up and down in a substrate processing apparatus, the lift apparatus comprising:
   a body configured to support the object while a lift hole, included in the body, is overlapped by the object in a vertical direction;
   a lift pin configured to move the object up and down by moving up and down in the lift hole;
   a bellows provided under the body and including an upper flange combined with a lower portion of the body; a lower flange spaced apart from the upper flange in the vertical direction; and a flexible pipe interposed between the upper flange and the lower flange and surrounding at least a part of the lift pin;
   a connector combined with a lower end of the lift pin in the flexible pipe and configured to interfere with downward movement of the lift pin and to allow at least one from among rotation, sliding, and tilting of the lift pin;
   a load sensor provided under the connector, that is combined with the lower end of the lift pin, and configured to measure vertical load, through the connector, generated in accordance with movement of the lift pin and to generate load information;
   an actuator configured to move the lift pin up and down; and
   a controller connected to the load sensor and configured to determine at least one of a magnitude of load applied to the object and a contact initiation point between the object and the lift pin based on the load information,
   wherein the entirety of the load sensor is disposed under the connector, and
   wherein the connector comprises:
      a lower support in which a mounting hole is formed; and
      a rotating body positioned in the mounting hole.

2. The lift apparatus of claim 1, wherein the load sensor is in the flexible pipe and is interposed between the connector and the lower flange.

3. The lift apparatus of claim 1, wherein the load sensor is outside the flexible pipe and is interposed between the lower flange and the actuator.

4. The lift apparatus of claim 1, wherein the lower flange comprises:
   a mounting body provided on the actuator and combined with the flexible pipe; and
   a deformable body combined with the connector in the mounting body and configured to bend in accordance with the movement of the lift pin, and
   wherein the load sensor is combined with a lower portion of the deformable body and measures load based on a degree of deformity of the deformable body.

5. The lift apparatus of claim 1, wherein the connector further comprises:
   a curved contact configured to contact an internal bottom surface of the lower support at one point, and
   a joint that extends upward from the curved contact and in which a combining hole for fitting the lift pin is formed; and
   an upper support that covers the rotating body on the lower support, the upper support including a through hole in which the lift pin is positioned,
   wherein an internal side surface of the lower support and an external side surface of the rotating body are spaced apart from each other.

6. The lift apparatus of claim 1, wherein the connector comprises:
   a first flexure hinge including a first hinge shaft extending in a first direction and a second hinge shaft extending in a second direction perpendicular to the first direction; and
   a second flexure hinge provided on the first flexure hinge and including a third hinge shaft extending in the first direction and a fourth hinge shaft extending in the second direction.

7. The lift apparatus of claim 1, wherein the connector comprises at least one from among a universal joint, a ball socket joint, an Oldham's coupling, and a peak beam coupling.

8. The lift apparatus of claim 1, wherein the object is a substrate, and the controller is configured to analyze the magnitude of load applied to the substrate and control up and down movement of the lift pin based on the load information.

9. The lift apparatus of claim 1, wherein the object is a movable ring, and the controller is configured to determine the contact initiation point between the movable ring and the lift pin and control the actuator so that the lift pin is at the contact initiation point based on the load information.

10. A substrate processing apparatus comprising:
a process chamber configured to regulate a process space for processing a substrate;
a processing gas supply connected to the process chamber and configured to supply a processing gas for processing the substrate in the process space;
a plasma generator configured to form plasma in the process space;
an electrostatic chuck provided in the process space and configured to support the substrate; and
at least one lift configured to move one of the substrate and a movable ring surrounding the electrostatic chuck up and down,
wherein each of the at least one lift comprises:
a body in which a lift hole overlapped by one of the substrate and the movable ring in a vertical direction is formed;
a lift pin configured to move in the lift hole in the vertical direction and to move one of the substrate and the movable ring in the vertical direction;
a bellows combined with a lower portion of the body;
a connector combined with a lower end of the lift pin in the bellows and configured to interfere with downward movement of the lift pin and to allow at least one from among rotation, sliding, and tilting of the lift pin;
a load sensor provided under the connector, that is combined with the lower end of the lift pin, and configured to measure vertical load, through the connector, generated in accordance with movement of the lift pin and to generate load information; and
an actuator configured to move the lift pin up and down,
wherein the entirety of the load sensor is disposed under the connector, and
wherein the connector comprises:
a lower support in which a mounting hole is formed; and
a rotating body positioned in the mounting hole.

11. The substrate processing apparatus of claim 10, further comprising a controller connected to the load sensor and configured to determine a magnitude of load applied to the substrate or the movable ring based on the load information.

12. The substrate processing apparatus of claim 11,
wherein the at least one lift comprises a first lift and a second lift, and
wherein the controller is configured separately control the lift pin of the first lift and the lift pin of the second lift based on first load and second load respectively measured by the load sensor of the first lift and the load sensor of the second lift.

13. The substrate processing apparatus of claim 10, wherein the connector further comprises:
a curved contact configured to contact an internal bottom surface of the lower support at one point, and
a joint that extends upward from the curved contact and in which a combining hole for fitting the lift pin is formed; and
an upper support that covers the rotating body on the lower support, the upper support including a through hole in which the lift pin is positioned,
wherein an internal side surface of the lower support and an external side surface of the rotating body are spaced apart from each other.

14. The substrate processing apparatus of claim 10, wherein the connector comprises a ball socket joint including:
a ball-shaped joint ball combined with the lift pin; and
a joint socket accommodating the ball-shaped joint ball.

15. The substrate processing apparatus of claim 10, wherein the connector comprises:
a support link;
a driving link provided on the support link and combined with the lift pin; and
a connection link provided between the support link and the driving link, the connection link configured to rotate and tilt about a first axis in a direction parallel with a direction in which the lift pin extends on the support link, and slide on a plane perpendicular to the first axis.

16. A lift apparatus for moving an object up and down in a substrate processing apparatus, the lift apparatus comprising:
a body configured to support the object while overlapped by the object in a vertical direction;
a lift pin configured to move up and down in a lift hole and to move the object up and down;
a bellows comprising a flexible pipe, the bellows provided under the body;
a connector combined with a lower end of the lift pin in the flexible pipe and configured to interfere with downward movement of the lift pin;
a load sensor provided under the connector, that is combined with the lower end of the lift pin, and configured to measure vertical load, through the connector, generated in accordance with movement of the lift pin and to generate load information; and
an actuator configured to move the lift pin up and down,
wherein the entirety of the load sensor is disposed under the connector, and
wherein the connector comprises:
a lower support in which a mounting hole is formed; and
a rotating body positioned in the mounting hole.

17. The lift apparatus of claim 16, further comprising a controller connected to the load sensor and configured to determine at least one of a magnitude of load applied to the object and a contact initiation point between the object and the lift pin based on the load information;
and wherein the connector allows at least one from among rotation, sliding, and tilting of the lift pin.

18. The lift apparatus of claim 17, wherein, the object is a substrate, and the controller is configured to analyze the magnitude of load applied to the substrate and control up and down movement of the lift pin based on the load information.

19. The lift apparatus of claim 17, wherein the object is a movable ring, and the controller determines the contact initiation point between the movable ring and the lift pin and controls the actuator so that the lift pin is at the contact initiation point based on the load information.

20. The lift apparatus of claim 17, wherein the connector further comprises:
a curved contact configured to contact an internal bottom surface of the lower support at one point, and
a joint that extends upward from the curved contact and in which a combining hole configured to fit the lift pin is formed; and
an upper support that covers the rotating body on the lower support, the upper support including a through hole in which the lift pin is positioned, wherein an internal side surface of the lower support and an external side surface of the rotating body are spaced apart from each other.

\* \* \* \* \*